(12) United States Patent
Lee

(10) Patent No.: US 8,780,662 B2
(45) Date of Patent: Jul. 15, 2014

(54) SEMICONDUCTOR MEMORY DEVICE INCLUDING INITIALIZATION SIGNAL GENERATION CIRCUIT

(75) Inventor: Eun Ryeong Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 260 days.

(21) Appl. No.: 13/341,524

(22) Filed: Dec. 30, 2011

(65) Prior Publication Data

US 2013/0114350 A1    May 9, 2013

(30) Foreign Application Priority Data

Nov. 8, 2011  (KR) .................. 10-2011-0116136

(51) Int. Cl.
| | | |
|---|---|---|
| *G11C 7/00* | (2006.01) | |
| *G11C 11/406* | (2006.01) | |
| *G11C 7/22* | (2006.01) | |
| *G11C 7/10* | (2006.01) | |

(52) U.S. Cl.
CPC ............... *G11C 11/406* (2013.01); *G11C 7/22* (2013.01); *G11C 7/1051* (2013.01); *G11C 11/40615* (2013.01); *G11C 7/1057* (2013.01)
USPC .................. 365/222; 365/233.14; 365/189.05

(58) Field of Classification Search
CPC ........... G11C 11/406; G11C 11/40615; G11C 2211/4061; G11C 11/40618; G11C 2211/4067; G11C 7/22; G11C 7/1072; G11C 8/18; G11C 7/222; G11C 11/4076; G11C 7/1051; G11C 7/1078; G11C 7/106; G11C 7/1057
USPC ................................. 365/222, 233.14, 189.05
See application file for complete search history.

(56) References Cited

U.S. PATENT DOCUMENTS 8,284,615 B2 * 10/2012  Shim ..................... 365/185.25

* cited by examiner

*Primary Examiner* — Fernando Hidalgo
(74) *Attorney, Agent, or Firm* — William Park & Associates Patent Ltd

(57) ABSTRACT

An initialization signal generation circuit includes: an initialization signal output unit configured to generate an initialization signal which is enabled during at least a portion of an auto refresh operation period of the initialization mode, in response to a flag signal; a refresh signal generation unit configured to generate a preliminary refresh signal and a refresh counting signal having the same period as the auto refresh signal in response to the flag signal and an auto refresh signal; and a counter unit configured to count a counting signal in response to the refresh counting signal and generate a counting initialization signal, which is delayed by at least a pulse width of the refresh counting signal, after a time point where a combination of the counting signal becomes a preset combination.

36 Claims, 7 Drawing Sheets

SEMICONDUCTOR MEMORY DEVICE INCLUDING INITIALIZATION SIGNAL GENERATION CIRCUIT

CROSS-REFERENCES TO RELATED APPLICATIONS

The present application claims priority under 35 U.S.C. 119(a) to Korean Application No. 10-2011-0116136, filed on Nov. 8, 2011, in the Korean intellectual property Office, which is incorporated herein by reference in its entirety.

BACKGROUND

A semiconductor memory device normally starts an operation only when internal setting values are maintained to initial values. Therefore, an initialization (reset) operation for starting the operation of the semiconductor memory device is very important.

Semiconductor memory device having a variety of functions include a plurality of circuits of which the initial conditions should be decided, in order to perform a normal operation. The initialization (reset) operation should be performed before a memory chip is operated. In general, an auto refresh operation is repetitively performed by a counting operation during an initialization mode, thereby initializing a register, a memory cell region or the like.

The auto refresh operation refers to an operation of compensating for a loss caused by a leakage current of a circuit such as a memory cell of a semiconductor memory device, according to an auto refresh signal AREF. During the initialization mode, a normal operation of the semiconductor memory device is not performed. In order for the semiconductor memory device to perform a normal operation, a screen method is required to learn an end time point of the initialization mode.

In such a screen method, the level of an initialization signal DAI (Device Auto Initialization), which transitions at a time point where the initialization mode is ended, is detected through a DQ pad of the semiconductor memory device to screen the end time point of the initialization mode.

In addition, JEDEC (Joint Electron Device Engineering Council) defines a performance time of an initialization (reset) operation according to the specification of a semiconductor memory device. In the case of an LPDDR2 memory device, the initialization operation time thereof is limited to 10 us. Therefore, the LPDDR2 memory device should terminate the initialization operation within 10 us.

The initialization operation of the semiconductor memory device will be described with reference to FIG. 1. In the following descriptions, it is assumed that the auto refresh operation is repeated six times in the initialization mode, and the pulse width of a signal for disabling an initialization signal among internal signals may vary depending on a PVT variation.

First, the semiconductor memory device enters the initialization mode, and a power-up signal PWRUP is enabled to a logic high level after a power-up period where a power supply voltage supplied from outside approaches a target level. Then, when a reset signal RESET is inputted from outside after the power-up period, a flag signal RS_FLAG is enabled to a logic high level, and an initialization signal DAI is enabled to a logic high level.

Next, a first pulse of a preliminary refresh signal AREF_PRE is generated in response to the flag signal RS_FLAG, and a second pulse of the preliminary refresh signal AREF_PRE is generated in response to a falling edge of the auto refresh signal AREF. Furthermore, pulses after the second pulse are also generated in response of falling edges of the auto refresh signal AREF. Furthermore, a refresh initialization signal INIT_AREF and a refresh counting signal AREF_CNT having the same period as the preliminary refresh signal AREF_PRE are generated.

Then, counting signals CNT<1:3> for performing an auto refresh operation six times are counted according to the refresh counting signal AREF_CNT to set up a preset combination, and the counting initialization signal INIT_CNT is then enabled at a time point t0 to terminate the counting operation.

Here, when the counting signals CNT<1:3> correspond to the preset combination, it indicates that the counting operation is performed six times to set the counting signals CNT<1:3> to a combination of 'L, H, H'. When the counting signals CNT<1:3> are set to 'L, H, H', it means that the first counting signal CNT<1> is 'L', the second counting signal CNT<2> is 'H', and the third counting signal CNT<3> is 'H'.

The initialization signal DAI is disabled when the counting initialization signal INIT_CNT is enabled to a logic high level in a period where the preliminary refresh signal AREF_PRE is at a logic high level.

However, when the preliminary refresh signal AREF_PRE has a large pulse width as shown in a period A of FIG. 1 according to a PVT variation, a pulse of the counting initialization signal INIT_CNT may overlap the pulse of the preliminary refresh signal AREF_PRE generated in response to a fifth falling edge of the auto refresh signal AREF. In this case, a preliminary initialization signal DAI_PRE is disabled, and the initialization signal DAI is disabled at a time point t1 within the auto refresh period. Therefore, the auto refresh operation may not be performed sufficiently to a preset level in the initialization mode, and the end time point of the initialization mode may not be screened with precision.

SUMMARY

An embodiment of the present invention relates to a semiconductor memory device including an initialization signal generation circuit, which is capable of accurately setting a level change time point of an initialization signal even though a PVT variation occurs, thereby performing a stable initialization operation.

In one embodiment, an initialization signal generation circuit includes: an initialization signal output unit configured to enter an initialization mode and generate an initialization signal which is enabled during an auto refresh operation period of the initialization mode, in response to a flag signal; a refresh signal generation unit configured to generate a preliminary refresh signal and a refresh counting signal having the same period as the auto refresh signal in response to the flag signal and an auto refresh signal; and a counter unit configured to count a counting signal in response to the refresh counting signal and generate a counting initialization signal which is delayed by a pulse width of the refresh counting signal and then enabled after a time point where a combination of the counting signal becomes a preset combination.

In another embodiment, a semiconductor memory device includes: a flag signal generator configured to generate a flag signal in response to a reset signal inputted from outside in an initialization mode; an auto refresh signal generator configured to receive an idle signal and generate an auto refresh signal including a periodic pulse in the initialization mode; and an initialization signal generator configured to generate an initialization signal which is enabled during an auto refresh operation period of the initialization mode, in response to the flag signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
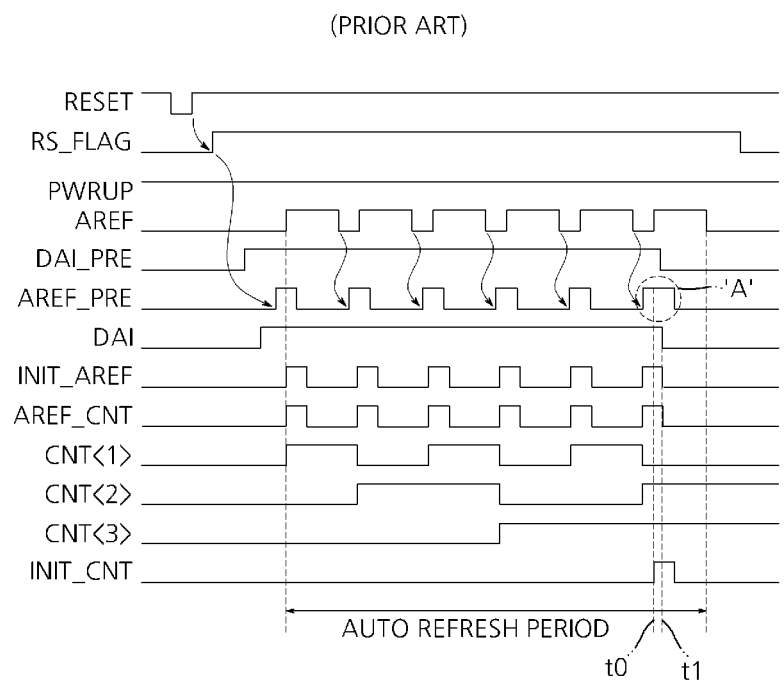
FIG. 1 is a timing diagram of internal signals of a known semiconductor memory device for generating an initialization signal.
Figure 2:
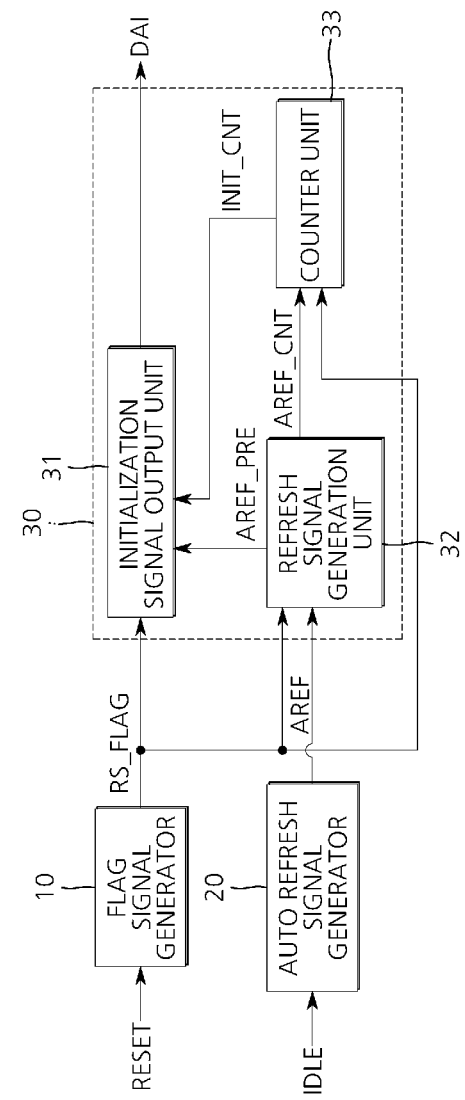
FIG. 2 is a block diagram of a semiconductor memory device in accordance with an embodiment of the present invention.

FIG. 2 is a block diagram of a semiconductor memory device in accordance with an embodiment of the present invention.

Referring to FIG. 2, the semiconductor memory device including an initialization signal generation circuit in accordance with an embodiment of the present invention includes a flag signal generator 10, an auto refresh signal generator 20, and an initialization signal generator 30. The flag signal generator 10 is configured to generate a flag signal RS_FLAG in response to a reset signal RESET inputted from outside in an initialization mode. The auto refresh signal generator 20 is configured to receive an idle signal IDLE and generate an auto refresh signal AREF including a periodic pulse in the initialization mode. The initialization signal generator 30 is configured to generate an initialization signal DAI which is enabled during an auto refresh operation period of the initialization mode, in response to the flag signal RS_FLAG. Here, the reset signal RESET is a signal which is inputted from outside when the semiconductor memory device performs an initialization operation, and the idle signal IDLE is a signal which is enabled in a standby state where the semiconductor memory device does not perform a read or write operation. Furthermore, the initialization mode refers to a mode where an auto refresh operation is performed after the semiconductor memory device enters the standby state.

Figure 3:
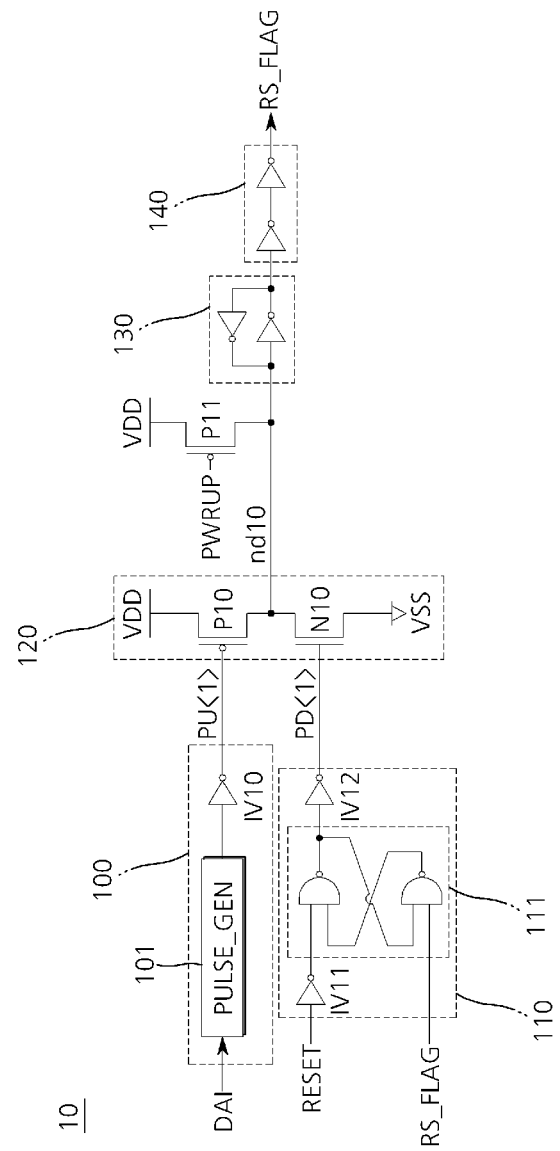
FIG. 3 is a circuit diagram of a flag signal generator of FIG. 2.

Referring to FIG. 3, the configuration of the flag signal generator 10 will be described in more detail as follows.

Referring to FIG. 3, the flag signal generator 10 includes a first pull-up signal generation unit 100, a first pull-down signal generation unit 110, a first driving unit 120, a first latch unit 130, and a first buffer unit 140. The first pull-up signal generation unit 100 is configured to generate a first pull-up signal PU<1> which is enabled when the initialization signal DAI is disabled. The first pull-down signal generation unit 110 is configured to generate a first pull-down signal PD<1> which is enabled in response to the reset signal RESET after a power-up period. The first driving unit 120 is configured to drive a first node nd10 in response to the first pull-up signal PU<1> and the first pull-down signal PD<1>. The first latch unit 130 is configured to latch a signal of the first node nd10. The first buffer unit 140 is configured to buffer an output signal of the first latch unit 130 and output the buffered signal as the flag signal RS_FLAG. Furthermore, the flag signal generator 10 further includes a first initialization element P11 configured to pull-up drive the first node nd10 in response to a power-up signal PWRUP which is enabled after the power-up period where a power supply voltage VDD supplied to the semiconductor memory device rises to a target voltage level.

More specifically, the first pull-up signal generation unit 100 includes a first pulse generator 101 and a first inverter IV10. The first pulse generator 101 is configured to receive the initialization signal DAI and generate a pulse having a predetermined width. The first buffer IV10 is configured to invert and buffer an output signal of the first pulse generator 101 and generate the first pull-up signal PU<1>. The second pull-down signal generation unit 110 includes a second inverter IV11, an SR latch section 111, and a third inverter IV12. The second inverter IV11 is configured to invert and buffer the reset signal RESET. The SR latch section 111 is configured to latch an output signal of the second inverter IV11 in response to the flag signal RS_FLAG, and buffer and output the latched signal. The third inverter IV12 is configured to invert and buffer the output signal of the SR latch section 11 and output the inverted signal as the first pull-down signal PD<1>. The first driving unit 120 includes a first pull-up driver P10 and a first pull-down driver N10. The first pull-up driver P10 is configured to pull-up drive the first node nd10 in response to the first pull-up signal PU<1>. The first pull-down driver N10 is configured to pull-down drive the first node nd10 in response to the first pull-down signal PD<1>. The flag signal generator 10 configured to such a manner disables the flag signal RS_FLAG in the power-up period, and enables the flag signal RS_FLAG in response to the reset signal RESET inputted from outside in the initialization mode after the power-up period.

The initialization signal generator 30 includes an initialization signal output unit 31, a refresh signal generation unit 32, and a counter unit 33. The initialization signal output unit 31 is configured to generate the initialization signal DAI which is enabled during the auto refresh operation period of the initialization mode, in response to the flag signal RS_FLAG. The refresh signal generation unit 32 is configured to generate a preliminary refresh signal AREF_PRE and a refresh counting signal AREF_CNT including a periodic pulse during the auto refresh operation period, in response to the flag signal RS_FLAG and the auto refresh signal AREF. The counter unit 33 is configured to count counting signals CNT<1:3> in response to the refresh counting signal AREF_CNT, and generate a counting initialization signal INIT_CNT which is delayed by a pulse width of the refresh counting signal AREF_CNT and then enabled after a time point where a combination of the counting signals CNT<1:3> becomes a preset combination.

The configuration of the initialization signal output unit 31 will be described in more detail as follows with reference to FIG. 4.

Figure 4:
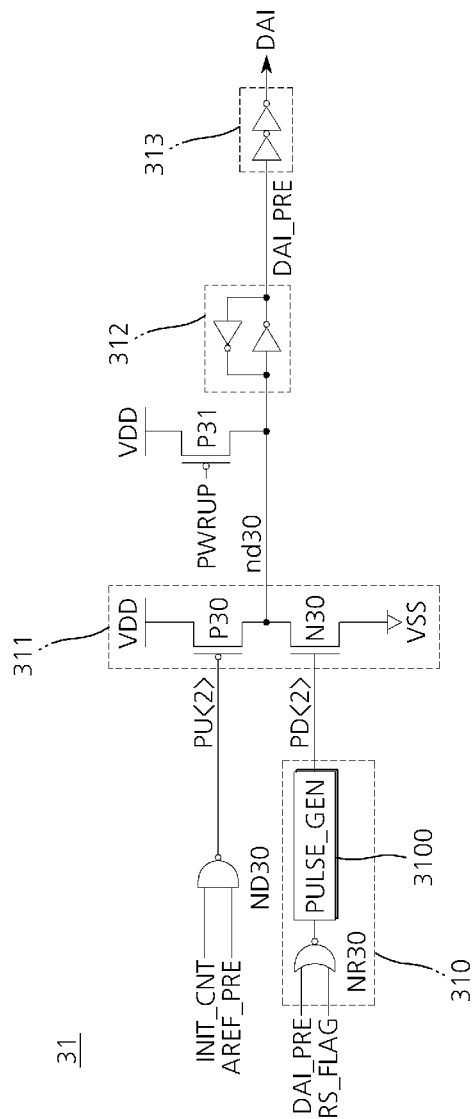
FIG. 4 is a circuit diagram of an initialization signal output unit of FIG. 2.

Referring to FIG. 4, the initialization signal output unit 31 includes a second pull-up signal generation unit ND30, a second pull-down signal generation unit 310, a second driving unit 311, a second latch unit 312, and a second buffer unit 313. The second pull-up signal generation unit ND30 is configured to perform a NAND operation on the counting initialization signal INIT_CNT and the preliminary refresh signal AREF_PRE and generate a second pull-up signal PU<2>. The second pull-down signal generation unit 310 is configured to generate a second pull-down signal PD<2> in response to a preliminary initialization signal DAI_PRE and the flag signal RS_FLAG. The second driving unit 311 is configured to drive a second node nd30 in response to the second pull-up signal PU<2> and the second pull-down signal PD<2>. The second latch unit 312 is configured to latch a signal of the second node nd30 and invert and buffer the latched signal to generate a preliminary initialization signal DAI_PRE. The second buffer unit 313 is configured to buffer the preliminary initialization signal DAI_PRE and output the buffered signal as the initialization signal DAI. Furthermore, the initialization signal generation unit 31 further includes a second initialization element P31 configured to pull-up drive the second node nd30 in response to the power-up signal PWRUP which is enabled after the power-up period in which the power supply voltage VDD supplied to the semiconductor memory device rises to a target voltage level.

More specifically, the second pull-up signal generation unit ND30 includes a NAND gate configured to perform a NAND operation on the counting initialization signal INIT_CNT and the preliminary refresh signal AREF_PRE and generate the second pull-up signal PU<2>. The second pull-down signal generation unit 310 includes a NOR gate NR30 and a second pulse generator 3100. The NOR gate NR30 is configured to perform a NOR operation on the preliminary initialization signal DAI_PRE and the flag signal RS_FLAG. The second pulse generator 3100 is configured to generate the second pull-up signal PU<2> including a pulse having a predetermined width in response to an output signal of the NOR gate NR30. The second driving unit 311 includes a second pull-up driver P30 and a second pull-down driver N30. The second pull-up driver P30 is configured to pull-up drive the second node nd30 in response to the second pull-up signal PU<2>. The second pull-down driver N30 is configured to pull-down drive the second node nd30 in response to the second pull-down signal PD<2>. The initialization signal output unit 31 configured in such a manner enables the initialization signal DAI in response to the flag signal RS_FLAG which is enabled in the initialization mode, and disables the initialization signal DAI according to pulses of the preliminary refresh signal AREF_PRE and the counting initialization signal INIT_CNT which is delayed by the pulse width of the refresh counting signal AREF_CNT and then enabled after the period where the combination of the counting signals CNT<1:3> becomes the preset combination in the initialization mode.

The configuration of the refresh signal generation unit 32 will be described in more detail as follows with reference to FIG. 5.

Figure 5:
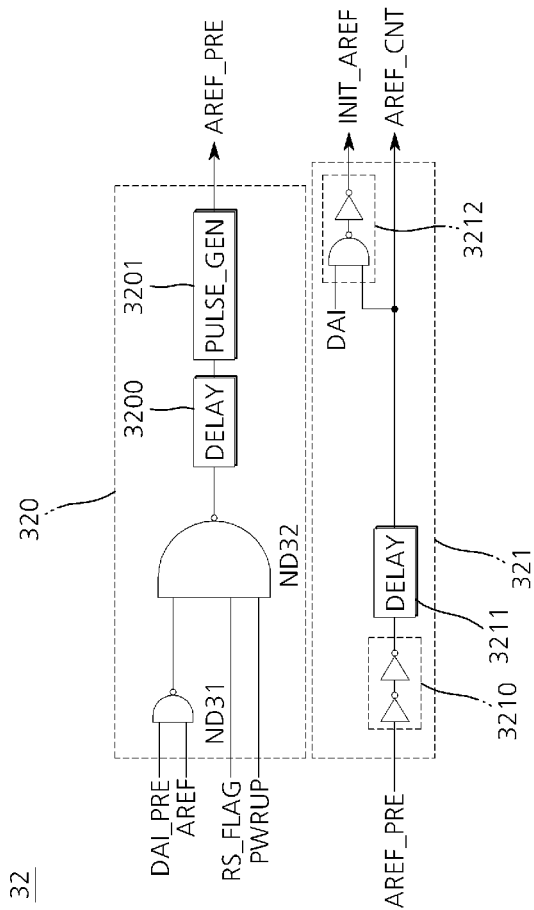
FIG. 5 is a circuit diagram of a refresh signal generator of FIG. 2.

Referring to FIG. 5, the refresh signal generation unit 32 includes a preliminary refresh signal generation unit 320 and a refresh counting signal generation unit 321. The preliminary refresh signal generation unit 320 is configured to generate the preliminary refresh signal AREF_PRE including a pulse having the same cycle as the auto refresh signal AREF in response to the flag signal RS_FLAG after the power-up period. The refresh counting signal generation unit 321 is configured to buffer the preliminary refresh signal AREF_PRE and generate the refresh counting signal AREF_CNT. Here, a first pulse of the preliminary refresh signal AREF_PRE is generated with a predetermined pulse width in response to the flag signal RS_FLAG, and a second pulse of the preliminary refresh signal AREF_PRE is generated with the predetermined pulse width in response to a falling edge of the auto refresh signal AREF. Furthermore, pulses after the second pulse of the preliminary refresh signal AREF_PRE are also generated in response to falling edges of the auto refresh signal AREF.

More specifically, the preliminary refresh signal generation unit 320 includes a first NAND gate ND31, a second NAND gate ND32, a first delay 3200, and a third pulse generator 3201. The first NAND gate ND31 is configured to perform a NAND operation on the preliminary initialization signal DAI_PRE and the auto refresh signal AREF. The second NAND gate ND32 is configured to perform a NAND operation on an output signal of the first NAND gate ND31, the flag signal RS_FLAG, and the power-up signal PWRUP. The first delay 3200 is configured to delay an output signal of the second NAND gate ND32. The third pulse generator 3201 is configured to generate the preliminary refresh signal AREF_PRE including a periodic pulse in response to an output signal of the first delay 3200. The refresh counting signal generation unit 321 includes a third buffer unit 3210, a second delay 3211, and a refresh initialization signal generator 3212. The third buffer unit 3210 is configured to buffer and output the preliminary refresh signal AREF_PRE. The second delay 3211 is configured to delay an output signal of the third buffer unit 3210 and output the delayed signal as the refresh counting signal AREF_CNT. The refresh initialization signal generator 3212 is configured to perform a NAND operation on the refresh counting signal AREF_CNT and the initialization signal DAI and generate the refresh initialization signal INIT_AREF. The refresh signal generation unit 32 configured in such a manner generates the refresh counting signal AREF_CNT, the refresh initialization signal INIT_AREF, and the preliminary refresh signal AREF_PRE including a pulse of the period where the auto refresh operation is repeated, in response to the flag signal RS_FLAG enabled in the initialization mode.

The configuration of the counter unit 33 will be described in more detail as follows with reference to FIG. 6.

Figure 6:
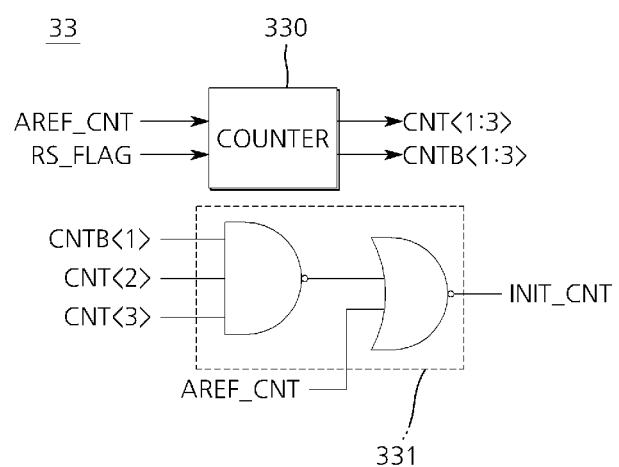
FIG. 6 is a circuit diagram of a counter unit of FIG. 2.

Referring to FIG. 6, the counter unit 33 includes a counter 330 and a counting initialization signal generation unit 331. The counter 330 is configured to count counting signals CNT<1:3> and CNTB<1:3> in response to the flag signal RS_FLAG and the refresh counting signal AREF_CNT. The counting initialization signal generation unit 331 is configured to generate the counting initialization signal INIT_CNT according to the logic level of the refresh counting signal AREF_CNT after a period where a combination of the counting signals CNT<1:3> and CNTB<1:3> becomes a preset combination. Here, the logic level comprises a logic high level and a logic low level. The "logic high level" and "logic low level" refers to, for example, voltage levels and/or voltage ranges that are predetermined to represent the high level or low level and not necessarily any specific values. Such "logic levels" may also be understood to correspond to logical or binary bit values, for example, where a "low logic level" corresponds to a logical "0" and a "high logic level" corresponds to a logical "1" or vice versa depending on specific implementations in the various embodiments. The counter unit 33 configured in such a manner counts the counting signals CNT<1:3> and CNTB<1:3> by the number of auto refresh operations which are repetitively performed in the initialization mode, and enables the counting initialization signal INIT_CNT according to the logic level of the refresh counting signal AREF_CNT after the period where the counting signals CNT<1:3> and CNTB<1:3> becomes a preset combination. Here, the counting signals CNTB<1:3> are inverted signals of the counting signals CNT<1:3>.

Figure 7:
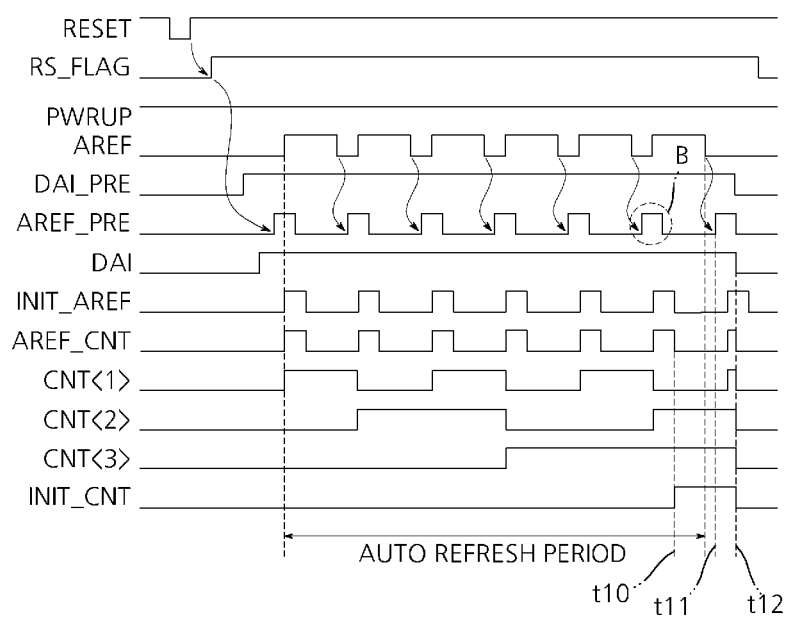
FIG. 7 is a timing diagram of internal signals for generating an initialization signal in accordance with an embodiment of the present invention.

The operation of the semiconductor memory device including the initialization signal generation circuit configured in such a manner will be described with reference to FIG. 7. In the following descriptions, it is assumed that the auto refresh operation is repeated six times in the initialization mode, and the pulse width of the preliminary refresh signal may vary depending on a PVT variation.

First, when the power supply voltage VDD is supplied to the semiconductor memory device, the first initialization element P11 of the flag signal generator 10 outputs the flog signal RS_FLAG having a logic low level, in response to the power-up signal PWRUP having a logic low level in the power-up period where the voltage level of the power supply voltage VDD rises to a target level. Furthermore, the second initialization element P31 of the power-up signal PWRUP outputs the initialization signal DAI having a logic low level, in response to the power-up signal PWRUP.

Next, when the reset signal RESET is enabled to a logic low level and inputted from outside after the power-up period, the first pull-down signal generation unit 110 of the flag signal generator 10 generates the first pull-down signal PD<1> having a logic high level, and the first pull-down driver N10 of the first driving unit 120 is configured to pull-down drive the first node nd10 in response to the high-level first pull-down signal PD<1> such that the flag signal RS_FLAG is enabled to a logic high level. Furthermore, the second pull-down signal generation unit 310 of the initialization signal output unit 31 generates the second pull-down signal PD<2> having a logic high level in response to the high-level flag signal RS_FLAG, and the second pull-down driver N30 of the second driving section 320 is configured to pull-down drive the second node nd30 in response to the high-level second pull-down signal PD<2> such that the initialization signal DAI is enabled to a logic high level.

Then, after the auto refresh operation is repeated six times to set a combination of the counting signals CNT<1:3> to a preset combination of 'L, H, H', the counting initialization signal generation unit 331 generates the counting initialization signal INIT_CNT having a logic high level at a time point t10 where the counting initialization signal INIT_CNT is delayed by the pulse width of the refresh counting signal AREF_CNT generated by buffering the preliminary refresh signal AREF_PRE. That is, although the pulse width of the preliminary refresh signal AREF_PRE may vary according to a PVT variation as shown in a period B of FIG. 7, the counting initialization signal INIT_CNT is enabled to a logic high level at the time point t10 where the refresh counting signal AREF_CNT generated by buffering the preliminary refresh signal AFEF_PRE is enabled to a logic low level. Here, when the counting signals CNT<1:3> are set to 'L, H, H', it means that the first counting signal CNT<1> is 'L', the second counting signal CNT<2> is 'H', and the third counting signal CNT<3> is 'H'.

Then, the second pull-up signal generation unit ND30 of the initialization signal output unit 31 generate the second pull-up signal PU<2> having a logic low level according to the high-level counting initialization signal INIT_CNT and the pulse of the preliminary refresh signal AREF_PRE which is generated in synchronization with a sixth falling edge of the auto refresh signal AREF at a time point t11. Furthermore, the second pull-up driver P30 of the second driving unit 311 is configured to pull-up drive the second node nd30 to a logic high level, in response to the low-level second pull-up signal PU<2>, and the second latch unit 312 generates the preliminary initialization signal DAI_PRE having a logic low level.

Then, the second buffer unit 313 of the initialization signal output unit 31 buffers the preliminary initialization signal DAI_PRE and outputs the initialization signal DAI having a logic low level at a time point t12. That is, after the auto refresh operation is performed six times in the initialization mode, the initialization signal DAI becomes a logic low level.

In accordance with the embodiment of the present invention, the semiconductor memory device may accurately set the level transitioning time point of the initialization signal, even though a PVT variation occurs. Therefore, the semiconductor memory device may perform the auto refresh operation to a desired level in the initialization mode, thereby performing a stable initialization operation. Furthermore, the semiconductor memory device may accurately screen the end time point of the initialization mode.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. An initialization signal generation circuit comprising:
an initialization signal output unit configured to generate an initialization signal which is enabled during at least a portion of an auto refresh operation period of an initialization mode, in response to a flag signal;
a refresh signal generation unit configured to generate a preliminary refresh signal and a refresh counting signal having the same period as an auto refresh signal in response to the flag signal and the auto refresh signal; and
a counter unit configured to count a counting signal in response to the refresh counting signal and generate a counting initialization signal, which is delayed by at least a pulse width of the refresh counting signal, after a time point where a combination of the counting signal becomes a preset combination.

2. The initialization signal generation circuit of claim 1, wherein the initialization signal output unit comprises:
a pull-up signal generation unit configured to perform a logic operation on the counting initialization signal and the preliminary refresh signal and generate a pull-up signal;
a pull-down signal generation unit configured to generate a pull-down signal which is enabled in response to the flag signal, after a power-up period;
a driving unit configured to drive a node in response to the pull-up signal and the pull-down signal;
a latch unit configured to latch a signal of the node and buffer the latched signal to generate a preliminary initialization signal; and
a buffer unit configured to buffer the preliminary initialization signal and output the buffered signal as the initialization signal.

3. The initialization signal generation circuit of claim 2, wherein the initialization signal output unit further comprises an initialization element configured to pull-up drive the node in response to a power-up signal which is enabled after the power-up period where the level of a power supply voltage approaches a target voltage level.

4. The initialization signal generation circuit of claim 2, wherein the pull-up signal comprises a signal which is enabled when the counting initialization signal is enabled and the preliminary refresh signal is enabled.

5. The initialization signal generation circuit of claim 2, wherein the pull-down signal comprises a signal which is enabled when the preliminary initialization signal is enabled.

6. The initialization signal generation circuit of claim 5, wherein the pull-down signal comprises a signal which is enabled when the flag signal is enabled.

7. The initialization signal generation circuit of claim 6, wherein the pull-down signal comprises a signal which is disabled when the preliminary initialization signal is disabled and the flag signal is disabled.

8. The initialization signal generation circuit of claim 2, wherein the driving unit pull-up drives the node when the pull-up signal is enabled.

9. The initialization signal generation circuit of claim 2, wherein the driving unit pull-down drives the node when the pull-down signal is enabled.

10. The initialization signal generation circuit of claim 2, wherein the refresh signal generation unit comprises:
   a preliminary refresh signal generation unit configured to generate the preliminary refresh signal including a pulse of which a period is adjusted so as to have the same period as the auto refresh signal in response to the flag signal after the power-up period; and
   a refresh counting signal generation unit configured to buffer the preliminary refresh signal and generate the refresh counting signal.

11. The initialization signal generation circuit of claim 10, wherein the preliminary refresh signal comprises a signal which is enabled when the auto refresh signal is disabled.

12. The initialization signal generation circuit of claim 10, wherein the refresh counting signal generation unit comprises a refresh initialization signal generator configured to buffer the refresh counting signal and generate a refresh initialization signal in response to the initialization signal.

13. The initialization signal generation circuit of claim 12, wherein the refresh initialization signal comprises a signal which is disabled when the initialization signal is disabled.

14. The initialization signal generation circuit of claim 1, wherein the counter unit comprises:
   a counter configured to count the counting signal in response to the flag signal and the refresh counting signal; and
   a counting initialization signal generation unit configured to generate the counting initialization signal which is enabled according to the logic level of the refresh counting signal at the time point where the combination of the counting signal becomes the preset combination.

15. A semiconductor memory device comprising:
   a flag signal generator configured to generate a flag signal in response to a reset signal inputted from outside in an initialization mode;
   an auto refresh signal generator configured to receive an idle signal and generate an auto refresh signal including a periodic pulse in the initialization mode; and
   an initialization signal generator configured to generate an initialization signal which is enabled during at least a portion of an auto refresh operation period of the initialization mode, in response to the flag signal,
   wherein the idle signal comprises a signal which is enabled in a standby state where the semiconductor memory device does not perform a read or write operation.

16. The semiconductor memory device of claim 15, wherein the initialization mode is where the auto refresh operation is performed after the semiconductor memory device enters the standby state.

17. The semiconductor memory device of claim 15, wherein the flag signal generator comprises:
   a first pull-up signal generation unit configured to generate a first pull-up signal which is enabled when the initialization signal is disabled;
   a first pull-down signal generation unit configured to generate a first pull-down signal which is enabled in response to the reset signal after a power-up period;
   a first driving unit configured to driving a first node in response to the first pull-up signal and the first pull-down signal;
   a first latch unit configured to latch a signal of the first node; and
   a first buffer unit configured to buffer an output signal of the first latch unit and output the buffered signal as the flag signal.

18. The semiconductor memory device of claim 17, wherein the flag signal generator further comprises a first initialization element configured to pull-up drive the first node in response to a power-up signal which is enabled after the power-up period where the level of a power supply voltage rises to a target voltage level.

19. The semiconductor memory device of claim 17, wherein the first pull-down signal comprises a signal which is disabled when the reset signal is disabled.

20. The semiconductor memory device of claim 19, wherein the first pull-down signal comprises a signal which is enabled when the flag signal is disabled and the reset signal is enabled.

21. The semiconductor memory device of claim 17, wherein the first driving unit pull-up drives the first node when the first pull-up signal is enabled.

22. The semiconductor memory device of claim 17, wherein the first driving unit pull-down drives the first node when the first pull-down signal is enabled.

23. The semiconductor memory device of claim 15, wherein the initialization signal generator comprises:
   an initialization signal output unit configured to generate the initialization signal which is enabled during at least a portion of the auto refresh operation period of the initialization mode, in response to the flag signal;
   a refresh signal generation unit configured to generate a preliminary refresh signal and a refresh counting signal having the same period as the auto refresh signal in response to the flag signal and the auto refresh signal; and
   a counter unit configured to count a counting signal in response to the refresh counting signal, and generate a counting initialization signal, which is delayed by at least a pulse width of the refresh counting signal, after a time point where a combination of the counting signal becomes a preset combination.

24. The semiconductor memory device of claim 23, the initialization signal output unit comprises:
   a second pull-up signal generation unit configured to perform a logic operation on the counting initialization signal and the preliminary refresh signal and generate a second pull-up signal;
   a second pull-down signal generation unit configured to generate a second pull-down signal which is enabled in response to the flag signal after a power-up period;
   a second driving unit configured to drive a second node in response to the second pull-up signal and the second pull-down signal;
   a second latch unit configured to latch a signal of the second node and buffer the latched signal to generate a preliminary initialization signal; and
   a second buffer unit configured to buffer the preliminary initialization signal and output the buffered signal as the initialization signal.

25. The semiconductor memory device of claim 24, wherein the initialization signal output unit further comprises a second initialization element configured to pull-up drive the second node in response to a power-up signal which is enabled after the power-up period where the level of a power supply voltage approaches a target voltage level.

26. The semiconductor memory device of claim 24, wherein the second pull-up signal comprises a signal which is enabled when the counting initialization signal is enabled and the preliminary refresh signal is enabled.

27. The semiconductor memory device of claim 24, wherein the second pull-up signal comprises a signal which is enabled when the preliminary initialization signal is enabled.

28. The semiconductor memory device of claim 27, wherein the second pull-down signal comprises a signal which is enabled when the flag signal is enabled.

29. The semiconductor memory device of claim 28, wherein the second pull-down signal comprises a signal which is disabled when the preliminary initialization signal is disabled and the flag signal is disabled.

30. The semiconductor memory device of claim 24, wherein the second driving unit pull-up drives the second node when the second pull-up signal is enabled.

31. The semiconductor memory device of claim 24, wherein the second driving unit pull-down drives the second node when the second pull-down signal is enabled.

32. The semiconductor memory device of claim 24, wherein the refresh signal generation unit comprises:
a preliminary refresh signal generation unit configured to generate a preliminary refresh signal including a pulse of which a period is adjusted so as to have the same period as the auto refresh signal in response to the flag signal after the power-up signal; and
a refresh counting signal generation unit configured to buffer the preliminary refresh signal and generate the refresh counting signal.

33. The semiconductor memory device of claim 32, wherein the preliminary refresh signal comprises a signal which is enabled when the auto refresh signal is disabled.

34. The semiconductor memory device of claim 32, wherein the refresh counting signal generation unit comprises a refresh initialization signal generation section configured to buffer the refresh counting signal and generate a refresh initialization signal in response to the initialization signal.

35. The semiconductor memory device of claim 34, wherein the refresh initialization signal comprises a signal which is disabled when the initialization signal is disabled.

36. The semiconductor memory device of claim 23, wherein the counter unit comprises:
a counter configured to count the counting signal in response to the flag signal and the refresh counting signal; and
a counting initialization signal generation unit configured to generate the counting initialization signal which is enabled according to the logic level of the refresh counting signal at the time point where the combination of the counting signal becomes the preset combination.

* * * * *